United States Patent [19]

Yamazaki

[11] Patent Number: 4,581,476

[45] Date of Patent: Apr. 8, 1986

[54] PHOTOELECTRIC CONVERSION DEVICE

[75] Inventor: Shunpei Yamazaki, Tokyo, Japan

[73] Assignee: Semiconductor Energy Laboratory Co., Ltd., Tokyo, Japan

[21] Appl. No.: 564,213

[22] Filed: Dec. 22, 1983

[30] Foreign Application Priority Data

Dec. 23, 1982 [JP] Japan ............................... 57-228158

[51] Int. Cl.[4] .............................................. H01L 31/06
[52] U.S. Cl. ....................................... 136/258; 357/2; 357/30; 357/88; 357/90; 136/255
[58] Field of Search ............ 136/258 AM, 255; 357/2, 357/30, 88, 90; 427/39, 74, 86; 148/174

[56] References Cited

FOREIGN PATENT DOCUMENTS 57-187972 11/1982 Japan ............................ 136/258 AM

OTHER PUBLICATIONS

M. Möller et al, *Conference Record, 16th IEEE Photovoltaic Specialists Conf.* (Sep. 1982) pp. 1376–1380.
"Investigation of the Hydrogen and Impurity Contents of Amorphous Silicon by Secondary Ion Mass Spectrometry", *Solar Cells*, vol. 2 (1980) pp. 365–376.

*Primary Examiner*—Aaron Weisstuch
*Attorney, Agent, or Firm*—Gerald J. Ferguson, Jr.

[57] ABSTRACT

A photoelectric conversion device has a non-single-crystal semiconductor laminate member formed on a substrate having a conductive surface, and a conductive layer formed on the non-single-crystal semiconductor laminate member. The non-single-crystal semiconductor laminate member has such a structure that a first non-single-crystal semiconductor layer having a P or N first conductivity type, an I-type second non-single-crystal semiconductor layer and a third non-single-crystal semiconductor layer having a second conductivity type opposite the first conductivity type are laminated in this order. The first (or third) non-single-crystal semiconductor layer is disposed on the side on which light is incident, and is P-type. The I-type non-single-crystal semiconductor layer has introduced thereinto a P-type impurity, such as boron which is distributed so that its concentration decreases towards the third (or first) non-single-crystal semiconductor layer in the thickness direction of the I-type layer.

16 Claims, 13 Drawing Figures

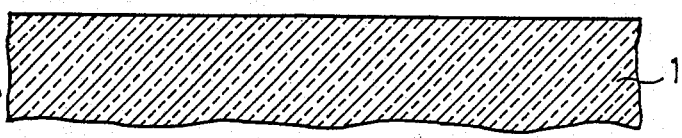
FIG. IA
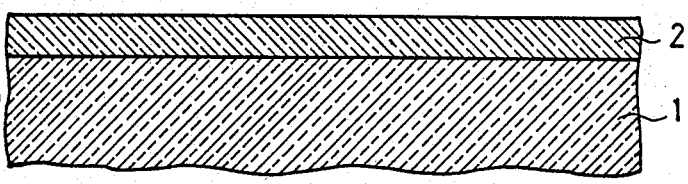
FIG. IB
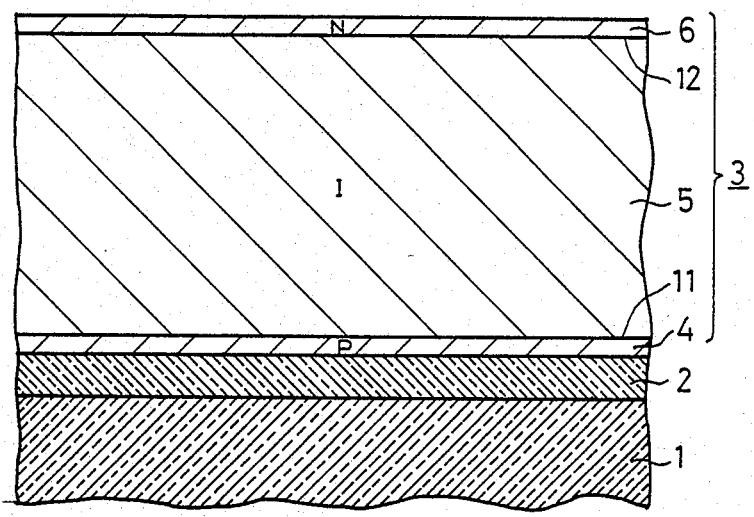
FIG. IC
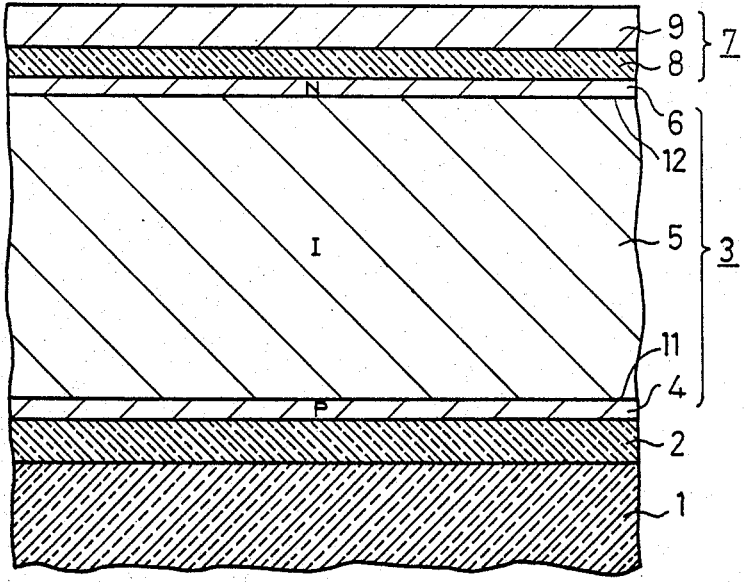
FIG. ID

PHOTOELECTRIC CONVERSION DEVICE

BACKGROUND OF THE INVENTION

1. Field of the Invention

The present invention relates to a photoelectric conversion device which has a non-single-crystal semiconductor laminate member having formed therein at least one PIN junction, and a method for the manufacture of such a photoelectric conversion device.

2. Description of the Prior Art

A photoelectric conversion device of the type including a non-single-crystal semiconductor laminate member having formed therein at least one PIN junction usually has the non-single-crystal semiconductor laminate member formed on a substrate having a conductive surface and a conductive layer formed on the non-single-crystal semiconductor laminate member. The non-single-crystal semiconductor laminate member has at least a first non-single-crystal semiconductor layer of a P or N first conductivity type, an I type second non-single-crystal semiconductor layer formed on the first non-single-crystal semiconductor layer and a third non-single-crystal semiconductor layer formed on the second non-single-crystal semiconductor layer and having a second conductivity type opposite from the first conductivity type. The first, second and third non-single-crystal semiconductor layers form one PIN junction.

In this case, for example, the substrate has such a structure that a light-transparent conductive layer is formed as a first conductive layer on a light-transparent insulating substrate body. The first and third non-single-crystal semiconductor layers of the non-single-crystal semiconductor laminate member are P- and N-type, respectively. Further, the conductive layer on the non-single-crystal semiconductor laminate member is formed as a second conductive layer on the N-type third non-single-crystal semiconductor layer.

With the photoelectric conversion device of such a structure as described above, when light is incident on the side of the light-transparent substrate towards the non-single-crystal semiconductor laminate member, electron-hole pairs are created by the light in the I-type second non-single-crystal semiconductor layer. Holes of the electron-hole pairs thus created pass through the P-type first non-single-crystal semiconductor layer to reach the first conductive layer, and electrons flow through the N-type third non-single-crystal semiconductor layer into the second conductive layer. Therefore, photocurrent is supplied to a load which is connected between the first and second conductive layers, thus providing a photoelectric conversion function.

In conventional photoelectric conversion devices of the type described above, however, since the I-type second non-single-crystal semiconductor layer is formed to contain oxygen with a concentration above $10^{20}$ atoms/cm$^3$, and/or carbon with a concentration above $10^{20}$ atoms/cm$^3$, and/or phosphorus with a concentration as high as above $5 \times 10^{17}$ atoms/cm$^3$, the I-type non-single-crystal semiconductor layer inevitably contains impurities imparting N conductivity type, with far lower concentrations than in the P-type first non-single-crystal semiconductor layer and the N-type third non-single-crystal semiconductor layer.

In addition, the impurity concentration has such a distribution that it undergoes substantially no variations in the thickness direction of the layer.

On account of this, in the case where the second non-single-crystal semiconductor layer is formed thick with a view to creating therein a large quantity of electron-hole pairs in response to the incidence of light, a depletion layer, which spreads into the second non-single-crystal semiconductor layer from the PI junction defined between the P-type first and the I-type second non-single-crystal semiconductor layers, and a depletion layer, which spreads into the second non-single-crystal semiconductor layer from the NI junction defined between the N-type third and the I-type second non-single-crystal semiconductor layers, are not linked together. In consequence, the second non-single-crystal semiconductor layer has, over a relatively wide range thickwise thereof at the central region in that direction, a region in which the bottom of the conduction band and the top of the valence band of its energy band are not inclined in the directions necessary for the holes and electrons to drift towards the first and third non-single-crystal semiconductor layers, respectively. Therefore, the holes and electrons of the electron-hole pairs created by the incident light in the second non-single-crystal semiconductor layer, in particular, the electrons and holes generated in the central region of the second layer in its thickness direction, are not effectively directed to the first and third non-single-crystal semiconductor layers, respectively.

Accordingly, the prior art photoelectric conversion devices of the above described structure have the defect that even if the second non-single-crystal semiconductor layer is formed thick for creating a large quantity of electron-hole pairs in response to incident light, a high photoelectric conversion efficiency cannot be obtained.

Further, even if the I-type second non-single-crystal semiconductor layer is thick enough to permit the depletion layer extending into the second non-single-crystal semiconductor layer from the PI junction between the P-type first non-single-crystal semiconductor layer on the side on which light is incident and the I-type second non-single-crystal semiconductor layer formed on the first semiconductor layer and the depletion layer extending into the second non-single-crystal semiconductor layer from the NI junction between the N-type third non-single-crystal semiconductor layer on the side opposite from the side of the incidence of light and the I-type second non-single-crystal semiconductor layer to be linked together, the expansion of the former depletion layer diminishes with the lapse of time for light irradiation by virtue of a known light irradiation effect commonly referred to as the Staebler-Wronski effect, because the I-type non-single-crystal semiconductor layer forming the PI junction contains impurities which impart N conductivity type as mentioned previously. Finally, the abovesaid depletion layers are disconnected from each other. In consequence, there is formed in the central region of the second non-single-crystal semiconductor layer in the thickness direction thereof a region in which the bottom of the conduction band and the top of the valence band of the energy band are not inclined in the directions in which the holes and electrons of the electron-hole pairs created by the incidence of light are drifted towards the first and third non-single-crystal semiconductor layers, respectively.

Accordingly, the conventional photoelectric conversion devices of the abovesaid construction have the defect that the photoelectric conversion efficiency is impaired by the long-term use of the devices.

SUMMARY OF THE INVENTION

It is therefore an object of the present invention to provide a novel photoelectric conversion device which is able to achieve a far higher photoelectric conversion efficiency than that obtainable with the conventional devices described above.

Another object of the present invention is to provide a novel photoelectric conversion device the photoelectric conversion efficiency of which is hardly or only slightly lowered by the Staebler-Wronski effect even if it is used for a long period of time.

Yet another object of the present invention is to provide a novel method which permits easy manufacture of the photoelectric conversion device having the above-said excellent features.

In accordance with an aspect of the present invention, the first (or third) non-single-crystal semiconductor layer of the non-single-crystal laminate member is a layer on the side on which light is incident and is of P conductivity type, and the I-type second non-single-crystal semiconductor layer has introduced therein an impurity for imparting thereto P type conductivity, which is distributed so that the impurity concentration continuously decreases towards the third (or first) non-single-crystal semiconductor layer in the thickness direction of the I-type layer.

In this case, for example, the substrate is light-transparent and, accordingly, the first non-single-crystal semiconductor layer is disposed on the side where light is incident. The first and third non-single-crystal semiconductor layers are P- and N-type, respectively, and the I-type second non-single-crystal semiconductor layer has introduced therein an impurity for imparting thereto P-type conductivity, such as boron, so that its concentration in the region adjacent the first non-single-crystal semiconductor layer is higher than the concentration in the region adjacent the third non-single-crystal semiconductor layer.

On account of this, even if the I-type second non-single-crystal semiconductor layer is formed relatively thick for creating therein a large quantity of electron-hole pairs in response to the incidence of light, the depletion layer extending into the second non-single-crystal semiconductor layer from the PI junction between the first and second non-single-crystal semiconductor layers and the depletion layer extending into the second non-single-crystal layer from the NI junction between the third and second non-single-crystal semiconductor layers are joined together. Accordingly, the holes and electrons which are produced in the central region of the second non-single-crystal semiconductor layer in its thickness direction are also effectively drifted towards the first and third non-single-crystal semiconductor layers, respectively.

Moreover, even if the I-type second non-single-crystal semiconductor layer contains impurities which impart thereto N-type conductivity, because it is formed to contain oxygen and/or carbon and/or phosphorus in large quantities as described previously, boron, which imparts P-type conductivity and is introduced into the second non-single-crystal semiconductor layer, combines with oxygen, and/or carbon, and/or phosphorus. Besides, the P-type impurity introduced into the second non-single-crystal semiconductor layer has a high concentration in the region thereof adjacent the P-type first non-single-crystal semiconductor layer, that is, on the side of the PI junction. Therefore, the expansion of the depletion layer spreading into the second non-single-crystal semiconductor layer from the PI junction between the first and second non-single-crystal semiconductor layers is scarcely or only slightly diminished by the light irradiation effect (the Staeabler-Wronski effect).

Accordingly, the photoelectric conversion device of the present invention retains a high photoelectric conversion efficiency, even if used for a long period of time.

In accordance with another aspect of the present invention, the second non-single-crystal semiconductor layer, which has introduced thereinto an impurity which imparts P-type conductivity, with such a distribution that its concentration continuously decreases towards the N-type third (or first) non-single-crystal semiconductor layer in the thickness direction of the second layer, can easily be formed, through a CVD (Chemical Vapor Deposition) method using a semiconductor material gas and an impurity material gas for imparting P-type conductivity, merely by continuously decreasing (or increasing) the concentration of the depart material gas relative to the semiconductor material gas with the lapse of time.

Accordingly, the manufacturing method of the present invention allows ease in the fabrication of the photoelectric conversion device of the present invention which possesses the aforementioned advantages.

Other objects, features and advantages of the present invention will become more fully apparent from the detailed description taken in conjunction with the accompanying drawings.

BRIEF DESCRIPTION OF THE DRAWINGS

FIGS. 1A to D are sectional views schematically illustrating a sequence of steps involved in the manufacture of a photoelectric conversion device in accordance with an embodiment of the present invention;

DESCRIPTION OF THE PREFERRED EMBODIMENTS

Figure 2A:
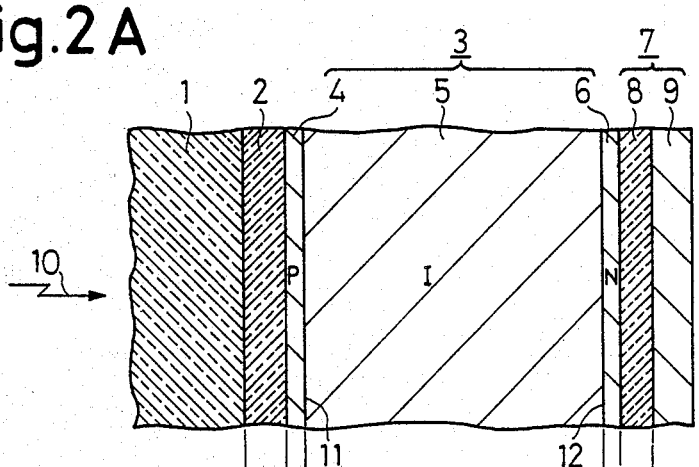
FIG. 2A is a sectional view schematically illustrating a first embodiment of the photoelectric conversion device by the manufacturing method shown in FIG. 1.

A description will be given of, with reference to FIGS. 1 and 2, of a first embodiment of the photoelectric conversion device of the present invention, along with the manufacturing method of the present invention.

The manufacture of the photoelectric conversion device starts with the preparation of an insulating, light-transparent substrate 1 as of glass (FIG. 1).

A light-transparent conductive layer 2 is formed on the substrate 1 (FIG. 1B).

The conductive layer 2 is formed of, for example, a tin oxide, or a light-transparent conductive material consisting principally of a tin oxide. The conductive layer 2 is formed by, for example, a known vacuum evaporation method to a thickness of, for instance, 0.1 to 0.2 $\mu$m.

Next, a non-single-crystal semiconductor laminate member 3 is formed on the conductive layer 2 (FIG. 1C).

The non-single-crystal semiconductor laminate member 3 has such a structure that a P-type non-single-crystal semiconductor layer 4, an I-type non-single-crystal semiconductor layer 5, and an N-type non-single-crystal semiconductor layer 6 are sequentially formed in this order. These non-single-crystal semiconductor layers 4, 5, and 6 form a PIN junction.

The non-single-crystal semiconductor layer 4 of the non-single-crystal semiconductor laminate member 3 is formed of, for example, Si, $Si_xC_{1-x}$ (where $0<x<1$, for instance, $x=0.8$) or Ge in an amorphous, semiamorphous, or microcrystalline form. The non-single-crystal semiconductor layer 4 is, for example, 100 angstroms thick. Moreover, the energy band gap of layer 4 is preferably larger than that of layer 5.

The non-single-crystal semiconductor layer 4 is formed by a CVD method which employs a semiconductor material gas composed of a hydride or halide of a semiconductor, such as Si, $Si_xGe_{1-x}$ (where $0<x<1$) or Ge, and an impurity material gas composed of a hydride or halide of a P-type impurity, for instance, diborane ($B_2H_6$). The CVD method may or may not employ a glow discharge (plasma), or light. In this case, the non-single-crystal semiconductor layer 4 has a P-type impurity introduced therein (boron) in a concentration above about $1 \times 10^{18}$ and as high as $1 \times 10^{19}$ to $6 \times 10^{20}$ atoms/cm$^3$, as shown in FIG. 2B.

The non-single-crystal semiconductor layer 5 is formed of, for instance, amorphous or semi-amorphous silicon, and has a thickness of, for example, 3 to 0.8 $\mu$m, in particular, 0.5 $\mu$m.

The non-single-crystal semiconductor layer 5 is formed by a CVD method which uses a semiconductor raw material gas composed of a hydride or halide of silicon, for example, $Si_nH_{2n+2}$ (where n is greater than or equal to 1), or $SiF_m$ (where m is greater than or equal to 2), and a deposit material gas composed of a hydride or halide of a P-type impurity, for instance, diborane ($B_2H_6$). The CVD method may or may not employ a glow discharge (plasma), or light. In this case, by decreasing the concentration of the deposit material gas relative to the concentration of the semiconductor material gas within a range of less than 5 ppm with the lapse of time, the non-single-crystal semiconductor layer 5 is formed having introduced thereinto a P-type impurity (boron) the concentration of which linearly and continuously decreases in the thickness direction of the layer towards the non-single-crystal semiconductor layer 6 as shown in FIG. 2B. The concentration of the P-type impurity in the non-single-crystal semiconductor layer 5 is high on the side of the non-single-crystal semiconductor layer 4 as compared with the impurity concentration on the side of the non-single-crystal semiconductor layer 6. The ratio of the impurity concentration in the layer 5 at one end thereof adjacent the layer 6 to the concentration at the other end adjacent the layer 4 is 1/10 to 1/100, preferably, 1/20 to 1/40. In practice, the P-type impurity (boron) has a concentration of $2 \times 10^{15}$ to $2 \times 10^{17}$ atoms/cm$^3$ at the end of the layer 5 adjacent the layer 4 and a concentration below $1 \times 10^{15}$ atoms/cm$^3$ at the end of the layer 5 adjacent the layer 6.

The non-single-crystal semiconductor layer 5 is formed by the abovesaid CVD method. In this case, the semiconductor raw material gas is one that is obtained by passing a semiconductor raw material gas through a molecular sieve or zeolite which adsorbs oxygen, and/or carbon and/or phosphorus. Accordingly, the non-single-crystal semiconductor layer 5 is formed to contain oxygen at a concentration less than $5 \times 10^{19}$ and as low as $5 \times 10^{18}$ atoms/cm$^3$, and/or carbon at a concentration less than $4 \times 10^{18}$ and as low as $4 \times 10^{15}$ atoms/cm$^3$, and/or phosphorus at a concentration at least as low as $5 \times 10^{15}$ atoms/cm$^3$.

The non-single-crystal semiconductor layer 6 is formed of, for instance, microcrystalline silicon, and has a thickness of, for example, 100 to 300 angstroms. Moreover, the energy band gap of layer 6 is preferably larger than that of layer 5.

The non-single-crystal semiconductor layer 6 is formed by a CVD method which employs a semiconductor raw material gas composed of a hydride or halide of silicon, for example, $Si_nH_{2n+2}$ (where n is greater than or equal to 1) or $SiF_m$ (where m is greater than or equal to 2), and an impurity material gas composed of a hydride or halide of an N-type impurity, for instance, phosphine ($PH_3$). The CVD method may or may not employ a glow discharge (plasma) or light. In this case, the non-single-crystal semiconductor layer 6 has an N-type impurity (phosphorus) introduced thereinto with a concentration of $1 \times 10^{19}$ to $6 \times 10^{20}$ atoms/cm$^3$, as shown in FIG. 2.

Next, a conductive layer 7 is formed on the non-single-crystal semiconductor laminate member 3 made up of the non-single-crystal semiconductor layers 4, 5, and 6, that is, on the non-single-crystal semiconductor layer 6 (FIG. 1D). Moreover, the energy band gap of layer 6 is, preferably larger than that of layer 5.

The conductive layer 7 has such a structure that a light-transparent conductive layer 8 formed of, for example, a tin oxide or a light-transparent conductive material consisting principally of tin oxide, and a reflective conductive layer 9 formed of a metal, such as aluminum, silver, or the like, are formed in this order. In this case, the conductive layer 8 is formed to a thickness of 900 to 1300 angstroms by means of, for example, vacuum evaporation, and the conductive layer 9 is also formed by vacuum evaporation.

Figure 2B:
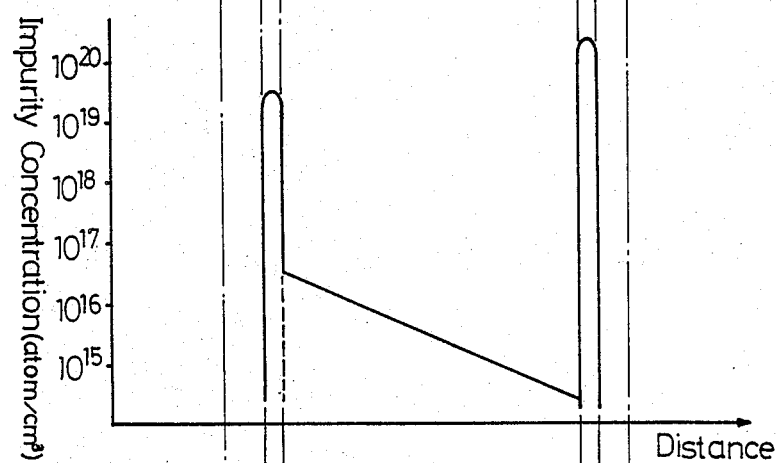
FIG. 2B is a graph showing the concentration distributions of impurities introduced into first, second, and third non-single-crystal semiconductor layers of the photoelectric conversion device depicted in FIG. 2A.

In the manner described above, the first embodiment of the photoelectric conversion device of the present invention shown in FIG. 2A is manufactured.

With the photoelectric conversion device shown in FIG. 2A, when light 10 is incident on the side of the substate 1 towards the non-single-crystal semiconductor laminate member 3, electron-hole pairs are created in the I-type non-single-crystal semiconductor layer 5 in response to the light 10. The holes of the electron-hole pairs thus produced flow through the P-type non-single-crystal semiconductor layer 4 into the light-transparent conductive layer 2, and the electrons flow through the N-type non-single-crystal semiconductor layer 6 into the conductive layer 7. Therefore, photo-current is supplied to a load which is connected between the conductive layers 2 and 7, thus providing the photoelectric conversion function.

In this case, the I-type non-single-crystal semiconductor layer 5 has a P-type impurity (boron) introduced thereinto which is distributed so that the impurity concentration continuously decreases towards the non-single-crystal semiconductor layer 6 in the thickness direction of the layer 5, as shown in FIG. 2B. On account of this, even if the I-type non-single-crystal semiconductor layer 5 is formed thick for generating therein a large quantity of electron-hole pairs in response to the incident of light, a depletion layer (not shown) which extends into the non-single-crystal semiconductor layer 5 from the PI junction 11 between the P-type non-single-crystal semiconductor layer 4 and the I-type non-single-crystal semiconductor layer 5 and a depletion (not shown) layer which extends into the non-single-crystal semiconductor layer 5 from the NI junction 12 between the N type non-single-crystal semiconductor layer 6 and the non-single-crystal semiconductor layer 5 are joined together. Therefore, the I-type non-single-crystal semiconductor layer 5, as viewed from the bottom of the conduction band and the top of the valence bands of its energy band, has a gradient that effectively causes holes and electrons to drift towards the non-single-crystal semiconductor layers 4 and 6, respectively.

Accordingly, the photoelectric conversion device of the present invention, shown in FIG. 2A, achieves a higher photoelectric conversion efficiency than do the conventional photoelectric conversion devices.

Figure 3:
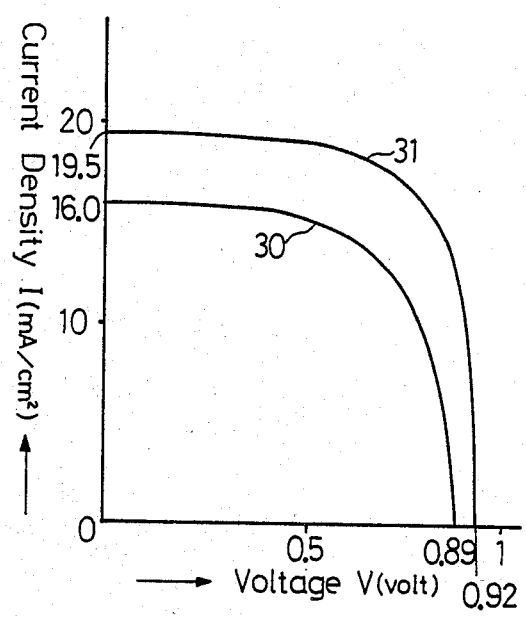
FIG. 3 is a graph showing the voltage V (volt)-current density I (mA/cm$^2$) characteristic of the photoelectric conversion device of FIG. 2, in comparison with the characteristic of a conventional photoelectric conversion device.

A photoelectric conversion device corresponding to the conventional one and which is identical in construction with the photoelectric conversion device of the present invention shown in FIG. 2A, except that the concentration of the N-type impurity in the I-type non-single-crystal semiconductor layer 5 is about $10^{16}$ atoms/cm$^3$, which is far lower than the impurity concentrations in the P-type and I-type non-single-crystal semiconductor layers 4 and 6 because the I-type non-single-crystal semiconductor layer 5 is formed to contain oxygen, and/or carbon, and/or phosphorus in large quantities, as referred to previously provided a voltage V (volt)-current density I (mA/cm$^2$) characteristic as indicated by curve 30 in FIG. 3. Accordingly, the open-circuit voltage was 0.89 V, the short-circuit current density I 16.0 mA/cm$^2$, the fill factor was 61%, and the photoelectric conversion efficiency about 8.7%. In contrast thereto, the photoelectric conversion device of the present invention shown in FIG. 2A, provided the voltage V -current density I characteristic as indicated by curve 31 in FIG. 3. Accordingly, the open-circuit voltage V was 0.92 V, which is higher than was obtained with the abovesaid device corresponding to the prior art device; the current density I was 19.5 mA/cm$^2$; the fill factor was 68%; and the photoelectric conversion efficiency was about 12.2%. Incidentally, these results were obtained under the conditions wherein the photoelectric conversion devices, each having a non-single-crystal semiconductor laminate member 3 of 1.05 cm$^2$ area, were exposed to irradiation by light with an intensity of AM1 (100 mW/cm$^2$).

In the case of the photoelectric conversion device of the present invention shown in FIG. 2A, since the I-type non-single-crystal semiconductor layer 5 has boron introduced thereinto as a P-type impurity the boron combines with the oxygen and/or carbon and/or phosphorus contained in the non-single-crystal semiconductor layer 5. In addition, the concentration of the P-type impurity (boron) is high on the side of the PI junction 11, that is, on the side of the P-type non-single-crystal semiconductor layer 4. Accordingly, the expansion of the depletion layer extending into the I-type non-single-crystal semiconductor layer 5 from the PI junction 11 between the P-type non-single-crystal semiconductor layer 4 and the I-type non-single-crystal semiconductor layer 5 is hardly or only slightly diminished by the light irradiation effect (the Staebler-Wronski effect).

For this reason, according to the photoelectric conversion device of the present invention, the aforesaid high photoelectric conversion efficiency is hardly impaired by long-term use.

Figure 4:
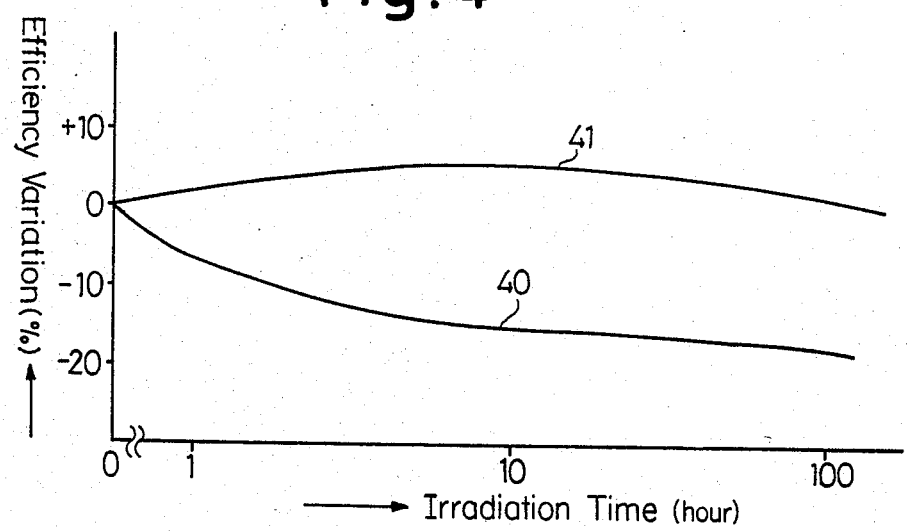
FIG. 4 is a graph showing variations (%) in the photoelectric conversion efficiency of the photoelectric conversion device of the present invention, shown in FIG. 2, in comparison with a conventional photoelectric converison device.

In addition, the aforesaid photoelectric conversion device corresponding to the prior art one which provided the voltage V-current density I characteristic indicated by the curve 30 in FIG. 3, exhibited variations (%) in the photoelectric conversion efficiency relative to the light irradiation time T (hr) as indicated by curve 40 in FIG. 4. In contrast thereto, in the case of the photoelectric conversion device of the present invention, the photoelectric conversion efficiency varied with the light irradiation time T as indicated by curve 41 in FIG. 4. That is, the photoelectric conversion efficiency slightly increased in an early stage and, thereafter, it decreased only very slightly with time. These results were also obtained under the same conditions mentioned previously in connection with FIG. 3.

As described above, the first embodiment of the photoelectric conversion device of the present invention possesses the advantage that it provides a higher photoelectric conversion efficiency than do the conventional photoelectric conversion devices, even when used for a long period of time.

Further, the manufacturing method of the present invention shown in FIG. 1 employs a series of simple steps such as forming the conductive layer 2 on the substrate 1, forming the non-single-crystal semiconductor layers 4, 5, and 6 on the conductive layer 2 through the CVD method to provide the non-single-crystal semiconductor laminate member 3, and forming conductor layer 7 on the non-single-crystal semiconductor laminate member 3. The I-type non-single-crystal semiconductor layer 5 is formed by a CVD method using a semiconductor raw material gas and a P-type deposit (boron) gas and, in this case, simply by continuously changing the concentration of the deposit material gas relative to the concentration of the semiconductor raw material gas as a function of time, the P-type impurity is introduced into the layer 5 with such a concentration distribution that its concentration continuously decreases towards the non-single-crystal semiconductor layer 6 in the thickness direction of the layer 5.

Accordingly, the manufacturing method of the present invention allows ease in the fabrication of the photoelectric conversion device of the present invention which has the aforementioned advantages.

Figure 2C:
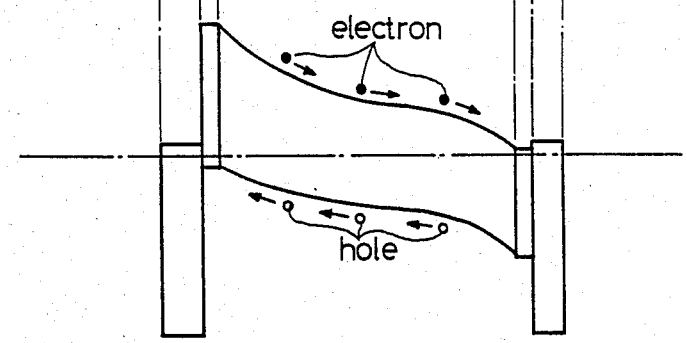
FIG. 2C is a graph showing the energy band of the photoelectric conversion device shown in FIG. 2A.

Incidentally, the first embodiment illustrated in FIG. 2 shows the case in which the impurity contained in the I-type non-single-crystal semiconductor layer 5 has such a concentration distribution as shown in FIG. 2B in which the concentration linearly and continuously drops towards the non-single-crystal semiconductor layer 6.

Figure 5A:
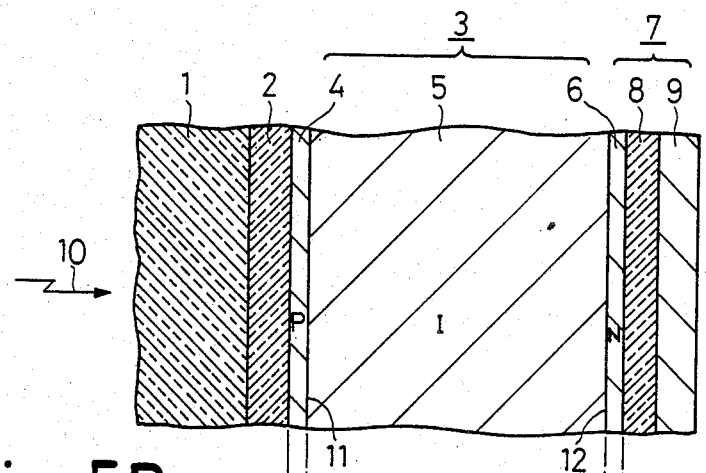
FIG. 5A is a sectional view schematically illustrating a second embodiment of the photoelectric conversion device of the present invention.
Figure 5B:
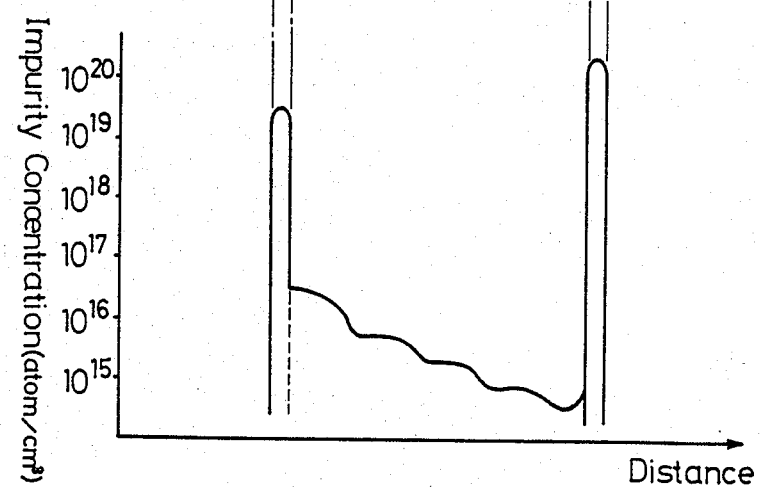
FIG. 5B is a graph showing concentration distributions of impurities introduced into first, second, and third non-single-crystal semiconductor layers of the second embodiment of the present invention.
Figure 6A:
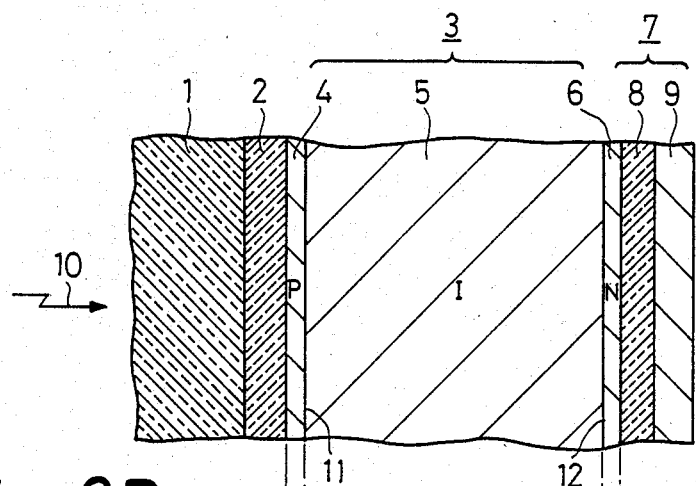
FIG. 6A is a sectional view sechematically illustrating a third embodiment of the photoelectric conversion device of the present invention.
Figure 6B:
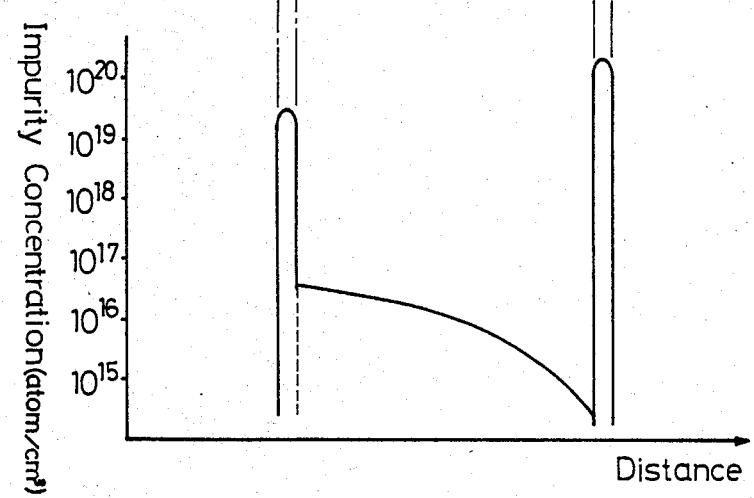
FIG. 6B is a graph showing the concentration distributions of impurities introduced into first, second, and third non-single-crystal semiconductor layers of the photoelectric conversion device shown in FIG. 6A.

As will be appreciated from the above, however, even if the impurity introduced in the I-type non-single-crystal semiconductor layer 5 has a concentration profile such that the impurity concentration drops stepwise and continuously towards the non-single-crystal semiconductor layer 6 as shown in FIG. 5 which illustrates a second embodiment of the present invention, and even if the impurity in the layer 5 has such a concentration distribution that the impurity concentration decreases non-linearly and continuously towards the layer 6 in a manner to obtain a concentration distribution such that the impurity concentration abruptly drops in the end portion of the layer 5 adjacent the layer 6 as shown in FIG. 6 which illustrates a third embodiment of the present invention, the photoelectric conversion device of the present invention produces the same excellent operation and effects as are obtainable with the photoelectric conversion device shown in FIG. 2.

Further, the foregoing description has been given of the case where light is incident on the photoelectric conversion device from the side of the substrate 1 and, accordingly, the non-single-crytal semiconductor layer 4 of the non-single-crystal semiconductor laminate member 3 on the side on which the light is incident is P-type.

But, also in case where the photoelectric conversion device is arranged to be exposed to light on the side opposite from the substrate 1, the non-single-crystal semiconductor layer 6 of the non-single-crystal semiconductor laminate member 3 on the side of the incidence of light is P-type, the non-single-crystal semiconductor layer 4 on the side of the substrate 1 is N-type and the non-single-crystal semiconductor layer 5 has introduced thereinto a P-type impurity (boron) which is distributed so that the impurity concentration continuously decreases towards the non single-crystal semiconductor layer 4 in the thickness direction of the layer 5, the same excellent operation and effects as described previously can be obtained, as will be understood from the foregoing description. In this case, however, the conductive layer 7 must be substituted with a light-transparent one. The substrate 1 and the conductive layer 2 need not be light-transparent.

While in the foregoing the non-single-crystal semiconductor laminate member 3 has one PIN junction, it is also possible to make the laminate member 3 have two or more PIN junctions and to form each of the two or more I-type non-single-crystal semiconductor layers so that the P-type impurity introduced therein may have the aforesaid concentration distribution.

It will be apparent that many modifications and variations may be effected without departing from the scope of the novel concepts of the present invention.

What is claimed is:

1. A photoelectric conversion device comprising:
a substrate having a conductive surface;
a non-single-crystal semiconductor laminate member formed on the substrate; and
a conductive layer formed on the non-single-crystal semiconductor laminate member;
wherein the non-single-crystal semiconductor laminate member has a first non-single-crystal semiconductor layer of P-type conductivity, an I-type second non-single-crystal semiconductor layer formed on the first non-single-crystal semiconductor layer, and a third non-single-crystal semiconductor layer of N-type conductivity formed on the second non-single-crystal semiconductor layer, the first, second, and third non-single-crystal semiconductor layers forming a PIN junction;
wherein the first non-single-crystal semiconductor layer is disposed on the side on which light is incident;
wherein the second non-single-crystal semiconductor layer has introduced thereinto a P-type impurity which is distributed so that its concentration continuously decreases towards the third non-single-crystal semiconductor layer in the thickwise direction of the second layer; and
wherein the second non-single-crystal semiconductor layer contains hydrogen or a halogen as a recombination center neutralizer and further contains oxygen at a concentration less than $5 \times 10^{19}$ atoms/cm$^3$.

2. A photoelectric conversion device comprising:
a substrate having a conductive surface;
a non-single semiconductor laminate member formed on the substrate; and
a conductive layer formed on the non-single-crystal semiconductor laminate member;
wherein the non-single-crystal semiconductor laminate member has a first non-single-crystal semiconductor layer of N-type conductivity, an I-type second non-single-crystal semiconductor layer formed on the first non-single-crystal semiconductor layer, and a third non-single-crystal semiconductor layer of P-type conductivity formed on the second non-single-crystal semiconductor layer, the first, second, and third non-single-crystal semiconductor layers forming an NIP junction;
wherein the third non-single-crystal semiconductor layer is disposed on the side on which light is incident;
wherein be second non-single-crystal semiconductor layer has introduced thereinto a P-type impurity which is distributed so that its concentration continuously decreases towards the first non-single-crystal semiconductor layer in the thickwise direction of the second layer; and
wherein the second non-single-crystal semiconductor layer contains hydrogen or a halogen as a recombination center neutralizer and further contains oxygen at a concentration less than $5 \times 10^{19}$ atoms/cm$^3$.

3. A photoelectric conversion device comprising:
a substrate having a conductive surface;
a non-single-crystal semiconductor laminate member formed on the substrate; and
a conductive layer formed on the non-single-crystal semiconductor laminate member;
wherein the non-single-crystal semiconductor laminate member has a first non-single-crystal semiconductor layer of P-type conductivity, an I-type second non-single-crystal semiconductor layer formed on the first non-single-crystal semiconductor layer, and a third non-single-crystal semiconductor layer of N-type conductivity formed on the second non-single-crystal semiconductor layer, the first, second, and third non-single-crystal semiconductor layers forming a PIN junction;

wherein the first non-single-crystal semiconductor layer is disposed on the side on which light is incident;

wherein the second non-single-crystal semiconductor layer has introduced thereinto a P-type impurity which is distributed so that its concentration continuously decreases towards the third non-single-crystal semiconductor layer in the thickwise direction of the second layer; and wherein the second non-single-crystal semiconductor layer contains hydrogen or a halogen as a recombination center neutralizer and further contains carbon at a concentration less than $4 \times 10^{18}$ atoms/cm$^3$.

4. A photoelectric conversion device comprising:
a substrate having a conductive surface;
a non-single-crystal semiconductor laminate member formed on the substrate; and
a conductive layer formed on the non-single-crystal semiconductor laminate member;

wherein the non-single-crystal semiconductor laminate member has a first non-single-crystal semiconductor layer of N-type first conductivity, an I-type non-single-crystal semiconductor layer formed on the first non-single-crystal semiconductor layer, and a third non-single-crystal semiconductor layer of P-type conductivity formed on the second non-single-crystal semiconductor layer, the first, second, and third non-single-crystal semiconductor layers forming an NIP junction;

wherein the third non-single-crystal semiconductor layer is disposed on the side on which light is incident;

wherein the second non-single-crystal semiconductor layer has introduced thereinto a P-type impurity which is distributed so that its concentration continuously decreases towards the first non-single-crystal semiconductor layer in the thickwise direction of the second layer; and wherein the second non-single-crystal semiconductor layer contains hydrogen or a halogen as a recombination center neutralizer and further contains carbon at a concentration less than $4 \times 10^{18}$ atoms/cm$^3$.

5. A photoelectric conversion device comprising:
a substrate having a conductive surface;
a non-single-crystal semiconductor laminate member formed on the substrate; and
a conductive layer formed on the non-single-crystal semiconductor laminate member;

wherein the non-single-crystal semiconductor laminate member has a first non-single-crystal semiconductor layer of P-type conductivity, an I-type second non-single-crystal semiconductor layer formed on the first non-single-crystal semiconductor layer, and a third non-single-crystal semiconductor layer of N-type conductivity formed on the second non-single-crystal semiconductor layer, the first, second, and third non-single-crystal semiconductor layers forming a PIN junction;

wherein the first non-single-crystal semiconductor layer is disposed on the side on which light is incident;

wherein the second non-single-crystal semiconductor layer has introduced thereinto a P-type impurity which is distributed so that its concentration continuously decreases towards the third non-single-crystal semiconductor layer in the thickwise direction of the second layer; and wherein the second non-single-crystal semiconductor layer contains hydrogen or a halogen as a recombination center neutralizer and further contains phosphorus at a concentration less than $5 \times 10^{15}$ atoms/cm$^3$.

6. A photoelectric conversion device comprising:
a substrate having a conductive surface;
a non-single-crystal semiconductor laminate member formed on the substrate; and
a conductive layer formed on the non-single-crystal semiconductor laminate member;

wherein the non-single-crystal semiconductor laminate member has a first non-single-crystal semiconductor layer of N-type first conductivity type, an I-type second non-single-crystal semiconductor layer formed on the first non-single-crystal semiconductor layer, and a third non-single-crystal semiconductor layer of P-type conductivity formed on the second non-single-crystal semiconductor layer, the first, second, and third non-single-crystal semiconductor layers forming an NIP junction;

wherein the third non-single-crystal semiconductor layer is disposed on the side on which light is incident;

wherein the second non-single-crystal semiconductor layer has introduced thereinto a P-type impurity which is distributed so that its concentration continuously decreases towards the first non-single-crystal semiconductor layer in the thickwise direction of the second layer; and wherein the second non-single-crystal semiconductor layer contains hydrogen or a halogen as a recombination center neutralizer and further contains phosphorous at a concentration less than $5 \times 10^{15}$ atoms/cm$^3$.

7. A photoelectric conversion device according to any one of claims 1 to 6, wherein the ratio of P-type impurity concentrations in the second non-single-crystal semiconductor layer at both ends thereof adjoining the first and third non-single-crystal semiconductor layers, respectively, is in the range of 1/10 to 1/100.

8. A photoelectric conversion device according to any one of claims 1, 3, or 5, wherein the substrate is light-transparent.

9. A photoelectric conversion device according to claim 8, wherein the P-type impurity introduced into the first non-single-crystal semiconductor layer is boron.

10. A photoelectric conversion device according to claim 8, wherein the concentration of the P-type impurity in the first non-single-crystal semiconductor layer is above $10^{18}$ atoms/cm$^3$, wherein the P-type impurity introduced into the second non-single-crystal semiconductor layer is boron and has a concentration in the range of $2 \times 10^{15}$ to $2 \times 10^{17}$ atoms/cm$^3$ at one end of the second layer adjoining the first non-single-crystal semiconductor layer, and wherein the ratio of the concentration of the P-type impurity in the second non-single-crystal semiconductor layer at the other end thereof adjoining the third non-single-crystal semiconductor to the P-type impurity concentration in the second layer at the said one end thereof is in the range of 1/10 to 1/100.

11. A photoelectric conversion device according to claim 10, wherein the first non-single-crystal semiconductor layer has a larger energy band gap than does the second non-single-crystal semiconductor layer.

12. A photoelectric conversion device according to claim 11, wherein the first non-single-crystal semiconductor layer is formed of $Si_xC_{1-x}$ (where $0<x<1$), and wherein the second non-single-crystal semiconductor layer is formed of silicon.

13. A photoelectric conversion device according to any one of claims 1, 4, or 5, wherein the P-type impurity introduced into the third non-single-crystal semiconductor layer is boron.

14. A photoelectric conversion device according to any one of claims 2, 4, or 5, wherein the concentration of the P-type impurity in the third non-single-crystal semiconductor layer is above $10^{18}$ atoms/cm$^3$, wherein the P-type impurity introduced into the second non-single-crystal semiconductor layer is boron and has a concentration in the range of $2\times10^{15}$ to $2\times10^{17}$ atoms/cm$^3$ at one end of the second layer adjoining the third non-single-crystal semiconductor layer, and wherein the ratio of the concentration of the P-type impurity in the second non-single-crystal semiconductor layer at the other end thereof adjoining the first non-single-crystal semiconductor to the P-type impurity concentration in the second layer at the said one end thereof is in the range of 1/10 to 1/100.

15. A photoelectric conversion device according to claim 14, wherein the third non-single-crystal semiconductor layer has a larger energy band gap than does the second non-single-crystal semiconductor layer.

16. A photoelectric conversion device according to claim 15, wherein the third non-single-crystal semiconductor layer is formed of $Si_xC_{1-x}$ (where $0<x<1$), and wherein the second non-single-crystal semiconductor layer is formed of silicon.

* * * * *